(12) United States Patent
Wang et al.

(10) Patent No.: US 10,163,724 B2
(45) Date of Patent: Dec. 25, 2018

(54) INTEGRATED CIRCUIT DEVICE AND METHOD OF MANUFACTURING SAME

(75) Inventors: Pai-Chieh Wang, Zhubei (TW); Yimin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 13/409,999

(22) Filed: Mar. 1, 2012

(65) Prior Publication Data
US 2013/0230952 A1    Sep. 5, 2013

(51) Int. Cl.
*H01L 21/8238*    (2006.01)

(52) U.S. Cl.
CPC ............... *H01L 21/823807* (2013.01); *H01L 21/823814* (2013.01)

(58) Field of Classification Search
CPC ..... H01L 21/823807; H01L 21/823814; H01L 29/66636; H01L 29/7834; H01L 29/6653; H01L 29/165; H01L 29/66507; H01L 29/66545; H01L 29/6656; H01L 29/6659; H01L 29/66628; H01L 29/66772; H01L 29/7833; H01L 29/7848; H01L 21/823864
USPC .......... 257/369, E21.619; 438/300, 302, 413
See application file for complete search history.

(56) References Cited

U.S. PATENT DOCUMENTS

| | | | | | |
|---|---|---|---|---|---|
| 5,538,909 A | * | 7/1996 | Hsu | ...................... | H01L 29/7834 257/E21.431 |
| 5,598,021 A | * | 1/1997 | O | ........................ | H01L 29/6656 257/301 |
| 5,721,443 A | * | 2/1998 | Wu | ....................... | H01L 29/7834 257/327 |
| 5,994,747 A | * | 11/1999 | Wu | ........................ | H01L 29/665 257/344 |
| 6,040,602 A | * | 3/2000 | Fulford | ............. | H01L 29/66636 257/344 |
| 6,198,142 B1 | * | 3/2001 | Chau et al. | .................... | 257/408 |
| 6,902,980 B2 | * | 6/2005 | Wang et al. | .................. | 438/305 |
| 7,429,775 B1 | * | 9/2008 | Nayak et al. | ................. | 257/369 |
| 7,446,379 B2 | * | 11/2008 | Li | ........................ | H01L 21/2254 257/382 |
| 7,510,943 B2 | * | 3/2009 | Li | ........................ | H01L 21/2253 257/E21.632 |
| 7,566,624 B2 | * | 7/2009 | Leitner | ............. | H01L 21/26586 438/299 |
| 7,642,607 B2 | * | 1/2010 | Wang et al. | .................. | 257/408 |
| 7,670,923 B1 | * | 3/2010 | Nayak et al. | ................. | 438/413 |
| 7,696,051 B2 | * | 4/2010 | Jin et al. | ....................... | 438/300 |
| 8,093,665 B2 | * | 1/2012 | Yang | ................. | H01L 29/66636 257/408 |
| 8,258,035 B2 | * | 9/2012 | Mathew | ............ | H01L 21/26586 438/290 |
| 8,871,584 B2 | * | 10/2014 | Tang | ................. | H01L 29/66795 257/E21.421 |

(Continued)

*Primary Examiner* — Sophia Nguyen
(74) *Attorney, Agent, or Firm* — Hauptman Ham, LLP

(57) ABSTRACT

An integrated circuit device and method for manufacturing the integrated circuit device is disclosed. The disclosed method provides improved protection for the bottom portion of the gate structure. In some embodiments, the method achieves improved protection for gate structure bottom by forming a recess on either side of the gate structure and placing spacers on the side walls of the gate structure, so that the spacers protect the portion of the gate structure below the gate dielectric layer.

20 Claims, 9 Drawing Sheets

(56) References Cited

U.S. PATENT DOCUMENTS

| | | | |
|---|---|---|---|
| 8,872,228 B2* | 10/2014 | Cheng | H01L 21/823807 257/192 |
| 2005/0224873 A1* | 10/2005 | Yu | H01L 29/665 257/E21.431 |
| 2006/0286757 A1* | 12/2006 | Power et al. | 438/305 |
| 2007/0193602 A1* | 8/2007 | Savas et al. | 134/1.1 |
| 2007/0254421 A1* | 11/2007 | Tsai et al. | 438/197 |
| 2008/0001260 A1* | 1/2008 | Zhu | H01L 29/045 257/622 |
| 2008/0132019 A1* | 6/2008 | Ku et al. | 438/300 |
| 2009/0001484 A1* | 1/2009 | Feudel et al. | 257/408 |
| 2009/0023258 A1* | 1/2009 | Liang et al. | 438/222 |
| 2009/0075029 A1* | 3/2009 | Thomas | H01L 21/02381 428/173 |
| 2009/0174002 A1* | 7/2009 | Ouyang | H01L 21/823807 257/369 |
| 2009/0221123 A1* | 9/2009 | Griebenow et al. | 438/305 |
| 2009/0267149 A1* | 10/2009 | Hua et al. | 257/347 |
| 2011/0012197 A1* | 1/2011 | Hung | H01L 21/823807 257/344 |
| 2011/0027955 A1* | 2/2011 | Woon et al. | 438/285 |
| 2011/0042753 A1* | 2/2011 | Jain et al. | 257/369 |
| 2011/0049643 A1* | 3/2011 | Matsuoka | H01L 21/28079 257/408 |
| 2011/0140170 A1* | 6/2011 | Dove | H01L 21/84 257/192 |
| 2011/0250725 A1* | 10/2011 | Yeh et al. | 438/232 |
| 2011/0312145 A1* | 12/2011 | Tsai et al. | 438/300 |
| 2012/0001238 A1* | 1/2012 | Tsai et al. | 257/255 |
| 2012/0037998 A1* | 2/2012 | Bedell | H01L 21/823807 257/369 |
| 2012/0058610 A1* | 3/2012 | Ookoshi | H01L 21/823807 438/230 |
| 2012/0108026 A1* | 5/2012 | Nieh | H01L 21/823807 438/300 |
| 2013/0049126 A1* | 2/2013 | Flachowsky | H01L 21/823814 257/369 |
| 2014/0048874 A1* | 2/2014 | Zhang | H01L 27/088 257/336 |

* cited by examiner

US 10,163,724 B2

INTEGRATED CIRCUIT DEVICE AND METHOD OF MANUFACTURING SAME

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as a metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often includes epitaxially grown silicon (Si) to form raised source and drain features for an n-type device, and epitaxially growing silicon germanium (SiGe) to form raised source and drain features for a p-type device. Various techniques directed at shapes, configurations, and materials of these source and drain features have been implemented to attempt to further improve transistor device performance. Although existing approaches have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
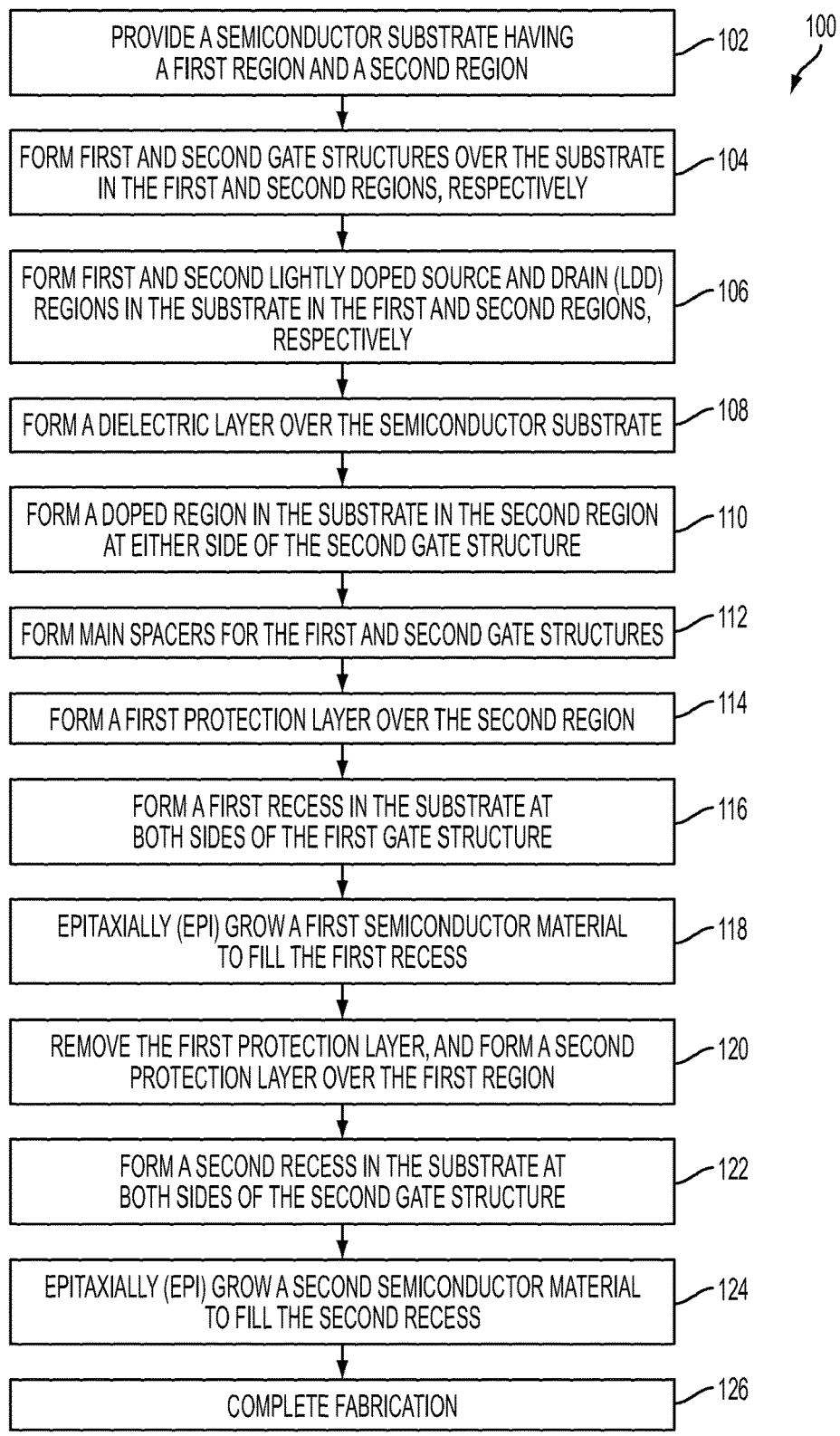
FIG. 1 is a flow chart of a method for fabricating an integrated circuit device according to one or more embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of an embodiment of a method 100 for fabricating an integrated circuit device according to various aspects of the present disclosure. The method 100 begins at block 102 where a semiconductor substrate having first and second regions is provided. At block 104, first and second gate structures are formed over the substrate in the first and second regions, respectively. At block 106, first and second lightly doped source and drain (LDD) regions are formed in the substrate in the first and second regions, respectively. The method continues with block 108 where a dielectric layer is formed over the semiconductor substrate. At block 110, a doped region is formed in the substrate in the second region at both sides of the second gate structure. The doped region includes a dopant of a type opposite a dopant used to form the second LDD region. The method 100 at block 112 includes forming main spacers for the first and second gate structures.

At blocks 114 and 116, a first protection layer is formed over the second region, and a first recess is formed in the substrate at both sides of the first gate structure in the first region. The method continues at block 118 where a first semiconductor material is epitaxially grown to fill the first recess, thereby forming source and drain features in the first region. At blocks 120 and 122, the first protection layer is removed from the second region, a second protection layer is formed over the first region, and a second recess is formed in the substrate at both sides of the second gate structure. At block 124, a second semiconductor material is epitaxially grown to fill the second recess, thereby forming source and drain features for the second region. The method 100 continues with block 126 where fabrication of the integrated circuit device is completed. Additional steps can be provided before, during, and after the method 100, and some of the steps described can be replaced or eliminated for additional embodiments of the method. The discussion that follows illustrates various embodiments of an integrated circuit device that can be fabricated according to the method 100 of FIG. 1.

FIGS. 2-9 are various diagrammatic cross-sectional views of an embodiment of an integrated circuit device 200 during various fabrication stages according to the method 100 of FIG. 1. FIGS. 2-9 have been simplified for the sake of clarity to better understand the inventive concepts of the present disclosure. In the depicted embodiment, as will be further discussed below, the integrated circuit device 200 includes field effect transistor devices, specifically an n-channel field effect transistor (NFET) and a p-channel field effect transistor (PFET). The integrated circuit device 200 can further include memory cells and/or logic circuits, passive components such as resistors, capacitors, inductors, and/or fuses; and active components, such as metal-oxide-semiconductor field effect transistors (MOSFETs), complementary metal-oxide-semiconductor transistors (CMOSs), high voltage transistors, and/or high frequency transistors; other suitable components; or combinations thereof. Additional features can be added in the integrated circuit device 200, and some of the features described below can be replaced or eliminated for additional embodiments of the integrated circuit device 200.

Figure 2:
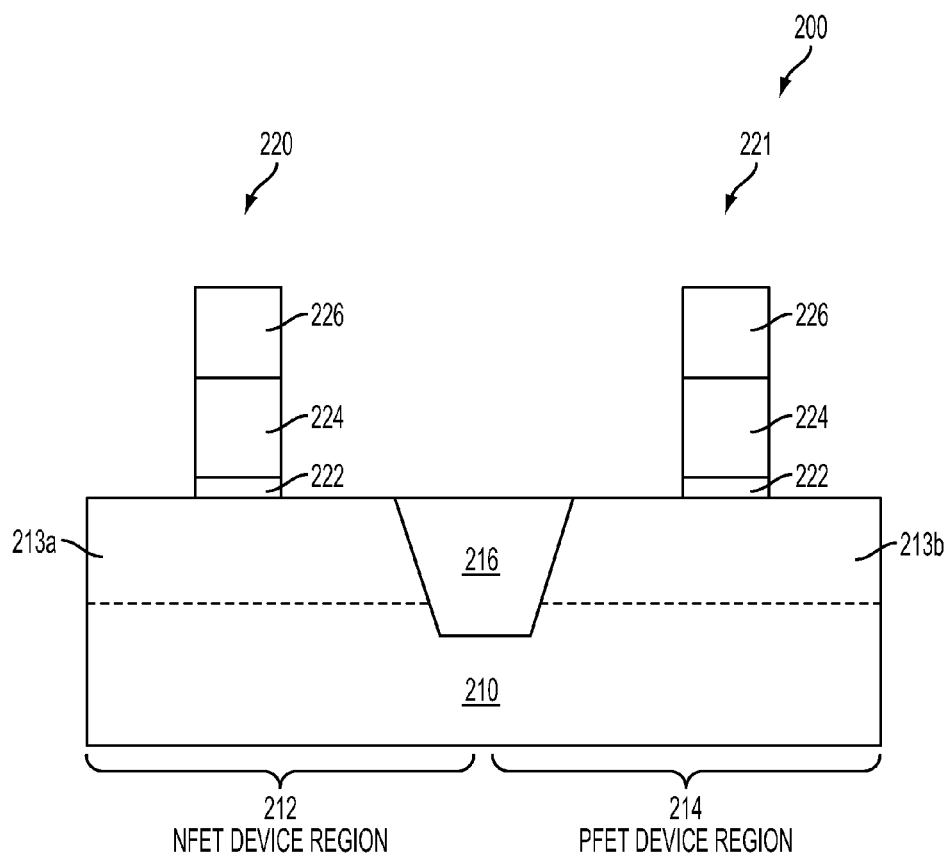
FIGS. 2-9 are various diagrammatic cross-sectional views of one or more embodiments of an integrated circuit device during various fabrication stages according to the method of FIG. 1.

In FIG. 2, a substrate 210 is provided. In some embodiments, the substrate 210 is a semiconductor substrate including silicon. The substrate may be a p-type or n-type substrate. Alternatively, the substrate 210 comprises another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 210 is a semiconductor on insulator (SOI). In other alternatives, semiconductor substrate 210 may include a doped epi layer, a gradient semiconductor layer, and/or a semiconductor layer overlying another semiconductor layer of a different type, such as a silicon layer on a silicon germanium layer.

The substrate 210 may include various doped regions depending on design requirements as known in the art (e.g., p-type wells or n-type wells). The doped regions may be doped with p-type dopants, such as boron or $BF_2$; n-type dopants, such as phosphorus or arsenic; or a combination thereof. The doped regions may be formed directly on the substrate 210, in a P-well structure, in a N-well structure, in a dual-well structure, or using a raised structure. The integrated circuit device 200 includes a device region 212 and device region 214 of the substrate 210, and thus, the substrate 210 may include various doped regions configured for a particular device in each region 212 and 214. In some embodiments, the NFET will be formed in the device region 212, which is referred to as an NFET device region, and the PFET device will be formed in the device region 214, which is referred to as a PFET device region. Accordingly, the device region 212 may include a doped region 213a configured for an NFET device, and the device region 214 may include a doped region 213b configured for a PFET device.

Isolation feature 216 is formed in the substrate 210 to isolate various regions of the substrate 210, such as device regions 212 and 214. The isolation feature 216 also isolates the device regions 212 and 214 from other devices (not shown). The isolation feature 216 utilizes isolation technology, such as local oxidation of silicon (LOCOS) and/or shallow trench isolation (STI), to define and electrically isolate the various regions. The isolation feature 216 comprises silicon oxide, silicon nitride, silicon oxynitride, other suitable materials, or combinations thereof. The isolation feature 216 is formed by any suitable process. As one example, forming an STI includes a photolithography process, etching a trench in the substrate (for example, by using a dry etching and/or wet etching), and filling the trench (for example, by using a chemical vapor deposition process) with one or more dielectric materials. For example, the filled trench may have a multi-layer structure, such as a thermal oxide liner layer filled with silicon nitride or silicon oxide. In another example, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize the oxide.

The integrated circuit device 200 includes a gate structure 220 for the NFET device and a gate structure 221 for the PFET device. The gate structure 220 is disposed over the substrate 210 in NFET device region 212, and the gate structure 221 is disposed over the substrate 210 in PFET device region 214. In the depicted embodiment, the gate structures 220 and 221 include a gate dielectric layer 222, a gate layer 224 (referred to as a gate electrode), and a hard mask layer 226. The gate dielectric layer 222, gate layer 224, and hard mask layer 226 form gate stacks for the gate structures 220 and 221. The gate stacks 220 and 221 may include additional layers as is known in the art. The gate structures 220 and 221 are formed by deposition, lithography patterning, etching processes, or combination thereof. The deposition processes include chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), plating, other suitable deposition methods, or combinations thereof. The lithography patterning processes include photoresist coating (e.g., spin-on coating), soft baking, mask aligning, exposure, post-exposure baking, developing the photoresist, rinsing, drying (e.g., hard baking), other suitable processes, or combinations thereof. Alternatively, the photolithography exposing process is implemented or replaced by other proper methods, such as maskless photolithography, electron-beam writing, or ion-beam writing. The etching processes include dry etching, wet etching, other etching methods, or combinations thereof. The gate structures 220 and 221 may be formed simultaneously, utilizing the same processing steps and processing materials; independently of one another, utilizing varying processing steps and processing materials; or using a combination of simultaneous and independent processing steps and processing materials.

The gate dielectric layer 222 is formed over the substrate 210 and includes a dielectric material, such as silicon oxide, silicon oxynitride, silicon nitride, a high-k dielectric material, other suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectric layer 222 may include a multilayer structure. For example, the gate dielectric layer 222 may include an interfacial layer, and a high-k dielectric material layer formed on the interfacial layer. An exemplary interfacial layer may be a grown silicon oxide layer formed by a thermal process or ALD process.

The gate layer 224 is formed over the gate dielectric layer 222. In some embodiments, the gate layer 224 is a polycrystalline silicon (polysilicon) layer. The polysilicon layer may be doped for proper conductivity. Alternatively, the polysilicon is not necessarily doped if a dummy gate is to be formed and replaced in a subsequent gate replacement process. Alternatively, the gate layer 224 could include a conductive layer having a proper work function, therefore, the gate layer 224 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials. The gate layer 224 may include other conductive materials, such as aluminum, copper, tungsten, metal alloys, metal silicide, other suitable materials, or combinations thereof. For example, where the gate layer 224 includes a work function layer, another conductive layer can be formed over the work function layer.

The hard mask layer 226 is formed over the gate layer 224. The hard mask layer 226 includes silicon oxide, silicon nitride, silicon oxynitride, silicon carbide, other suitable dielectric material, or combinations thereof. The hard mask layer 226 may have a multi-layer structure.

Figure 3:
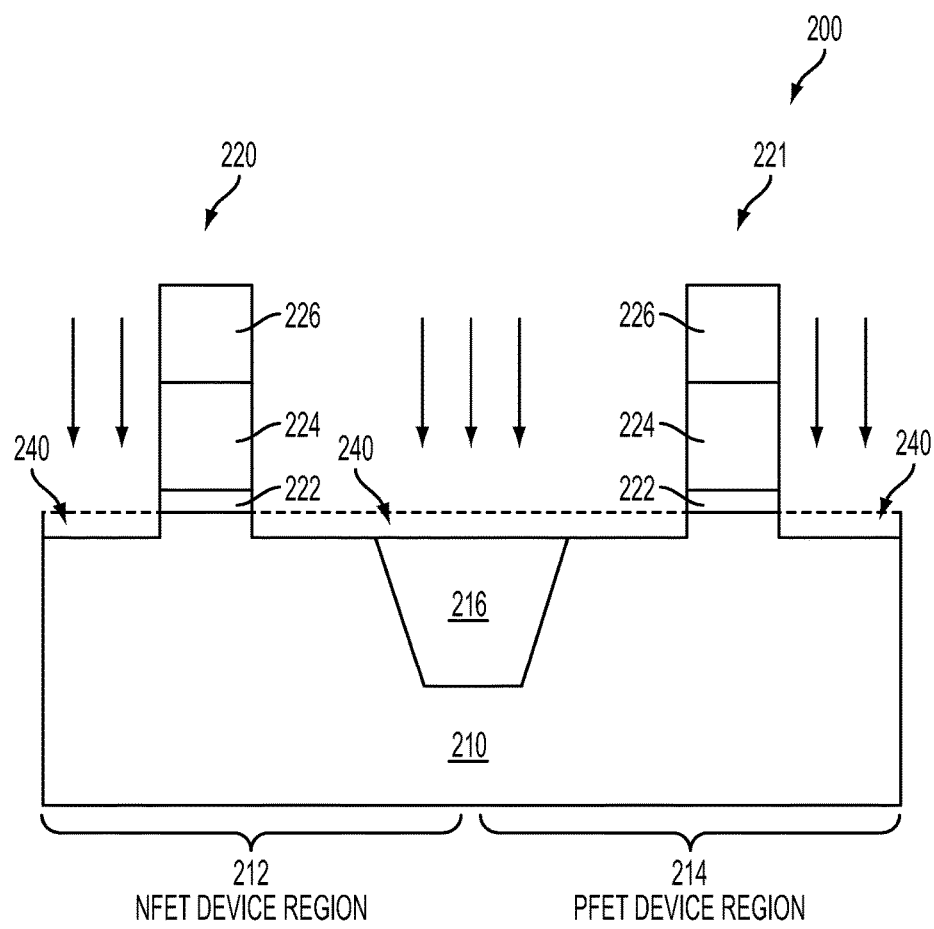

Next, as FIG. 3 shows, an etching process which removes portions of the substrate 210 from its top surface, so that recesses 240 are formed on both sides of the gate structures 220 and 222. As such the upper surfaces of the recesses 240 are lower than the original surface plane of the substrate 210 prior to the etching step. The etching process includes a dry etching process, wet etching process, or combination thereof. This extra level of recess ensures that bottom portions of the gate structures 220 and 221 will be fully protected by spacers that will be formed on the side walls of the gate electrodes.

Figure 4:
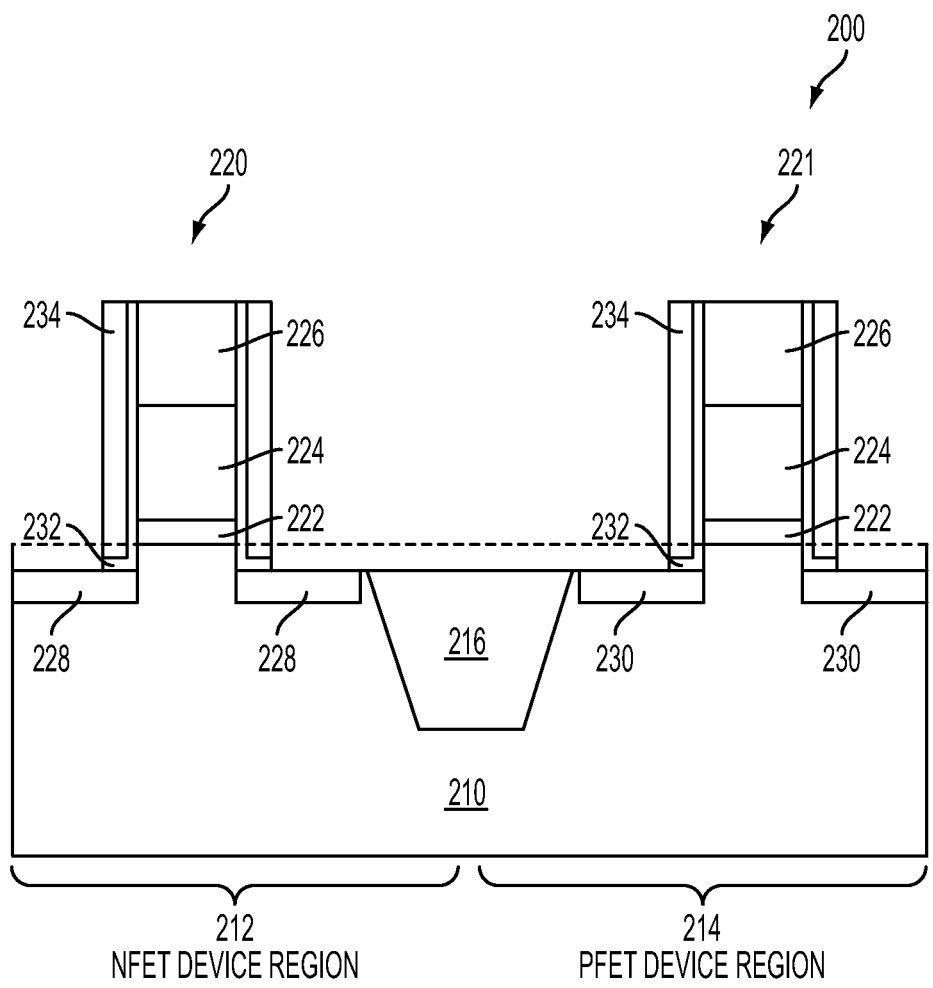

In FIG. 4, lightly doped source/drain (LDD) regions 228 and 230 are formed in source and drain regions of the substrate 210 in the device regions 212 and 214, respectively. In some embodiments, LDD regions 228 are formed in the substrate 210, interposed by the gate structure 220, in the NFET device region 212; and LDD regions 230 are formed in the substrate 210, interposed by the gate structure 221, in the PFET device region 214. The LDD regions 228 and 230 are aligned with sidewalls of the gate stacks of the gate structures 220 and 221. The LDD regions 228 and 230 are formed by an ion implantation process, diffusion process, other suitable process, or combination thereof. The PFET device region 214 may be protected during formation of the LDD regions 228 in the NFET device region 212, and the NFET device region 212 may be protected during formation of the LDD regions 230 in the PFET device region 214. For example, a photoresist layer or hard mask layer may be deposited and patterned over the PFET device region 214 during formation of the LDD regions 228 in the NFET device region 212, and a photoresist layer or hard mask layer can be deposited and patterned over the NFET device region 212 during formation of the LDD regions 230 in the PFET device region 214. In the depicted embodiment, the LDD regions 228 for the NFET device (NLDD) are doped with an n-type dopant, such as phosphorus or arsenic, and the LDD regions 230 for the PFET device (PLDD) are doped with a p-type dopant, such as boron or $BF_2$.

Also in FIG. 4, spacer liners 232 and offset (dummy) spacers 234 may be formed for the gate structures 220 and 221. In the depicted embodiment, the spacer liners 232 comprises an oxide material, such as silicon oxide, and the offset spacers 234 comprise a nitride material, such as silicon nitride. Alternatively, the offset spacers 234 includes another suitable dielectric material, such as silicon oxide, silicon oxynitride, or combinations thereof. The spacer liners 232 may also comprise another suitable dielectric material. The spacer liners 232 and offset spacers 234 are formed by a suitable process. For example, the spacer liners 232 and offset spacers 234 are formed by blanket depositing a first dielectric layer (a silicon oxide layer) over the integrated circuit device 200 and a second dielectric layer (a silicon nitride layer) over the first dielectric layer, and then, anisotropically etching to remove the dielectric layers to form the spacer liners 232 and offset spacers 234 as illustrated in FIG. 4. The spacer liners 232 and offset spacers 234 are positioned adjacent the sidewalls of the gate stacks (gate dielectric layer 222, gate layer 224, and hard mask layer 226) of the gate structures 220 and 221.

Figure 5:
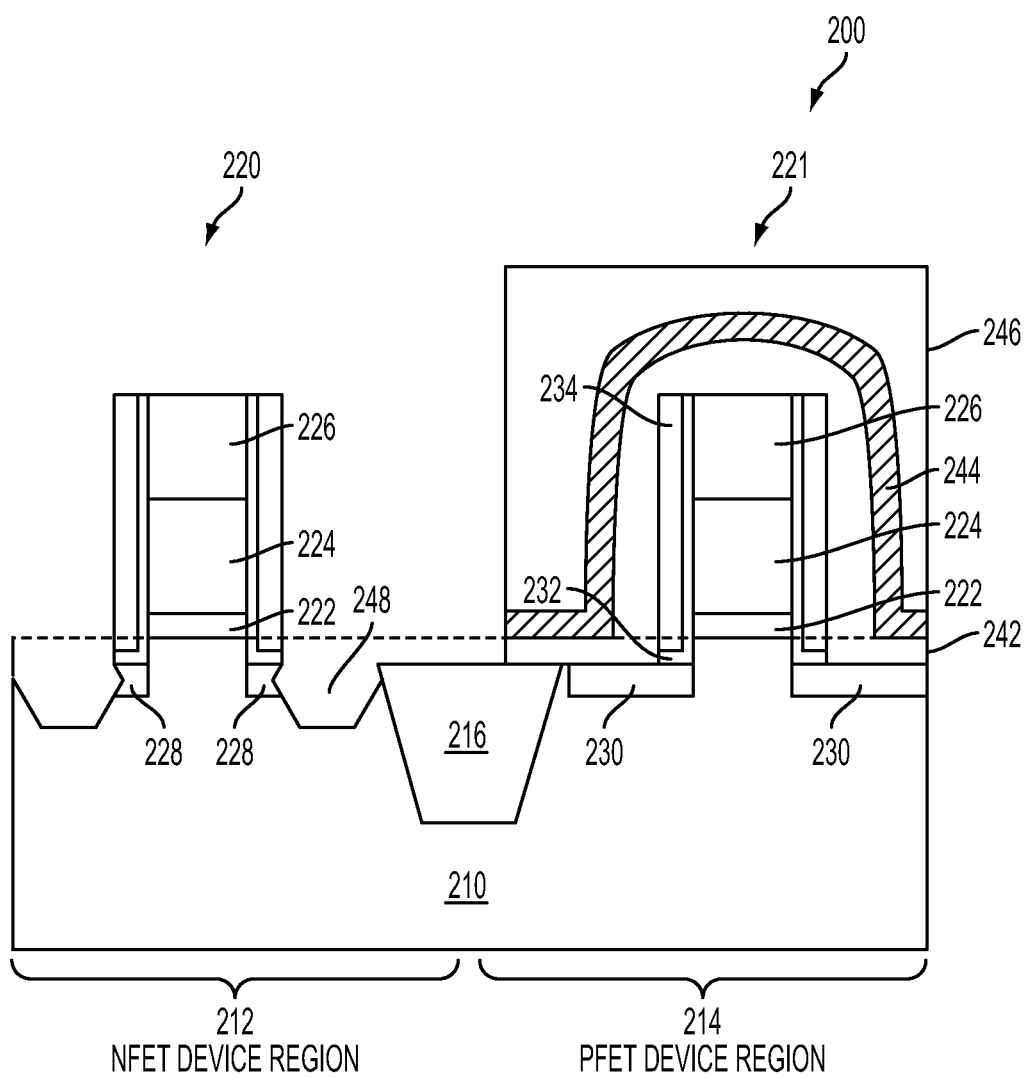
Figure 6:
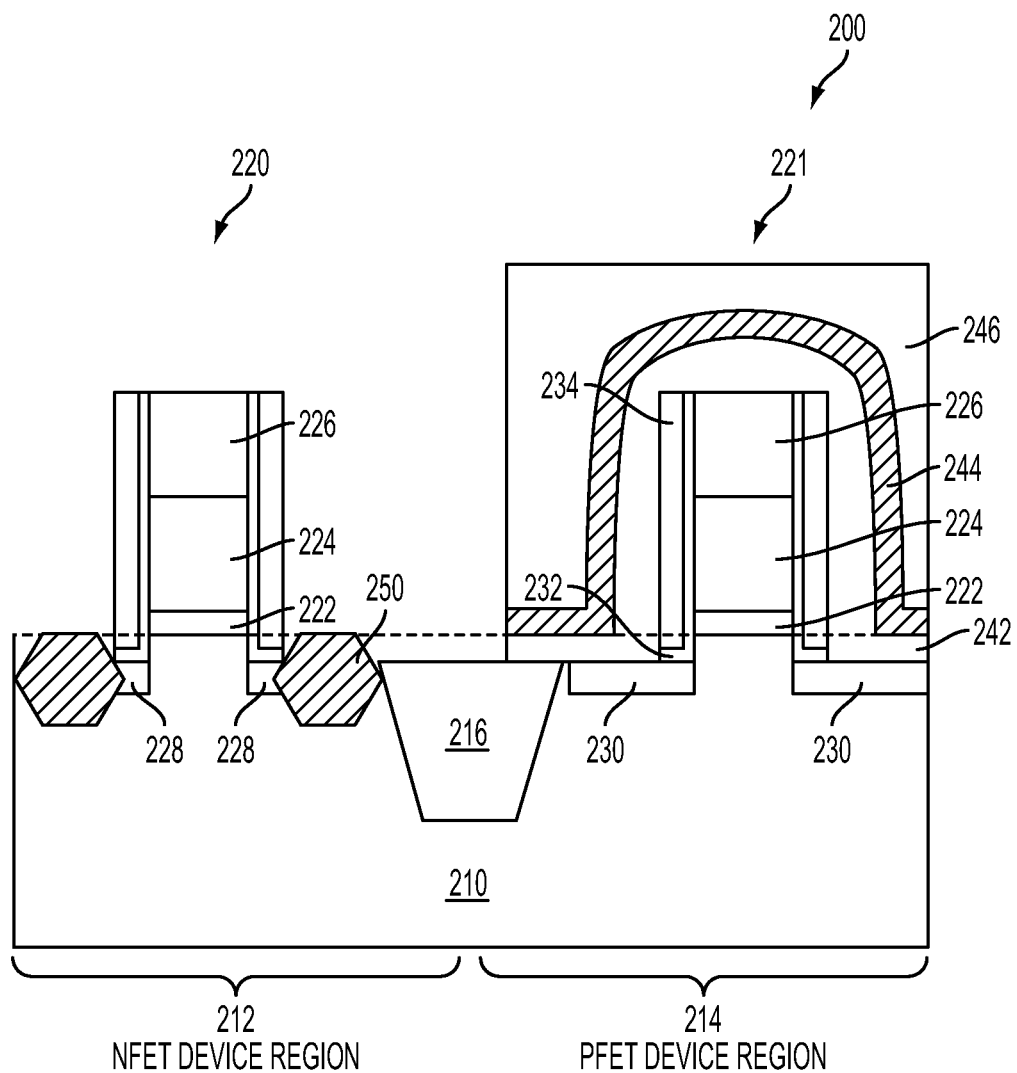

In FIGS. 5-9, source/drain engineering is performed to configure the source/drain region of the NFET device region 212 for an NFET device and to configure the source/drain region of the PFET device region 214 for a PFET device. In FIGS. 5 and 6, source/drain (S/D) features are formed in the NFET device region 212. For example, in FIG. 5, portions of the substrate 210 are removed at both sides of the gate structure 220 in the NFET device region 212, particularly in the source and drain region of the NFET device. In the depicted embodiment, a capping layer 242, a capping layer 244, and a photoresist layer 246 are formed over the integrated circuit device 200 and patterned to protect the PFET device during processing of the NFET device region 212. The capping layer 242 may comprise an oxide material, and the capping layer 244 may comprise a nitride material. The capping layers 242 and 244 may comprise other suitable materials as known in the art. The photoresist layer 246 may include an antireflective coating layer, such as a bottom antireflective coating (BARC) layer and/or a top antireflective coating (TARC) layer. The patterned layers 242, 244, and 246 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other suitable techniques, such as maskless photolithography, electron-beam writing, ion-beam writing, and molecular imprint.

An etching process then removes portions of the substrate 210 to form recesses 248 in the substrate 210. The recesses 248 are formed in the source and drain regions of the NFET device in the NFET device region 212. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, radio frequency (RF) bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mT to about 200 mT, a source power of about 200 W to about 2000 W, an RF bias voltage of about 0 V to about 100 V, a $NF_3$ gas flow rate of about 5 sccm to about 30 sccm, a $Cl_2$ gas flow rate of about 0 sccm to about 100 sccm, a He gas flow rate of about 0 sccm to about 500 sccm, and an Ar gas flow rate of about 0 sccm to about 500 sccm. In another example, the etching process includes an etching pressure of about 1 mT to about 200 mT, a source power of about 200 W to about 2000 W, an RF bias voltage of about 0 V to about 100 V, a $SF_6$ gas flow rate of about 5 sccm to about 30 sccm, a $Cl_2$ gas flow rate of about 0 sccm to about 100 sccm, a He gas flow rate of about 0 sccm to about 500 sccm, and an Ar gas flow rate of about 0 sccm to about 500 sccm. In yet another example, the etching process includes an etching pressure of about 1 mT to about 200 mT, a source power of about 200 W to about 2000 W, an RF bias voltage of about 0 V to about 100 V, a $CF_4$ gas flow rate of about 5 sccm to about 100 sccm, a $Cl_2$ gas flow rate of about 0 sccm to about 100 sccm, a He gas flow rate of about 0 sccm to about 500 sccm, and an Ar gas flow rate of about 0 sccm to about 500 sccm. The wet etching solutions may include $NH_4OH$, HF (hydrofluoric acid), TMAH (tetramethylammonium hydroxide), other suitable wet etching solutions, or combinations thereof. In an example, the wet etching process first implements a 100 parts water to 1 part HF concentration of an HF solution at room temperature, and then implements a NH$_4$OH solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the recesses 248 with a hydrofluoric acid (HF) solution or other suitable solution.

In FIG. 6, a semiconductor material is deposited in the recesses 248 to form source and drain features 250. The source and drain features 250 may alternatively be referred to as raised source and drain regions. In the depicted embodiment, an epitaxy or epitaxial (epi) process is performed to deposit the semiconductor material in the recesses 248. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 210. In the depicted embodiment, the source and drain features 250 include epitaxially grown silicon (epi Si). The epi Si source and drain features 250 of the NFET device associated with the gate structure 220 may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 250 may further be exposed to annealing processes, such as a rapid thermal annealing process. Thereafter, the patterned layers 242, 244, and 246 are removed by a suitable process.

Figure 7:
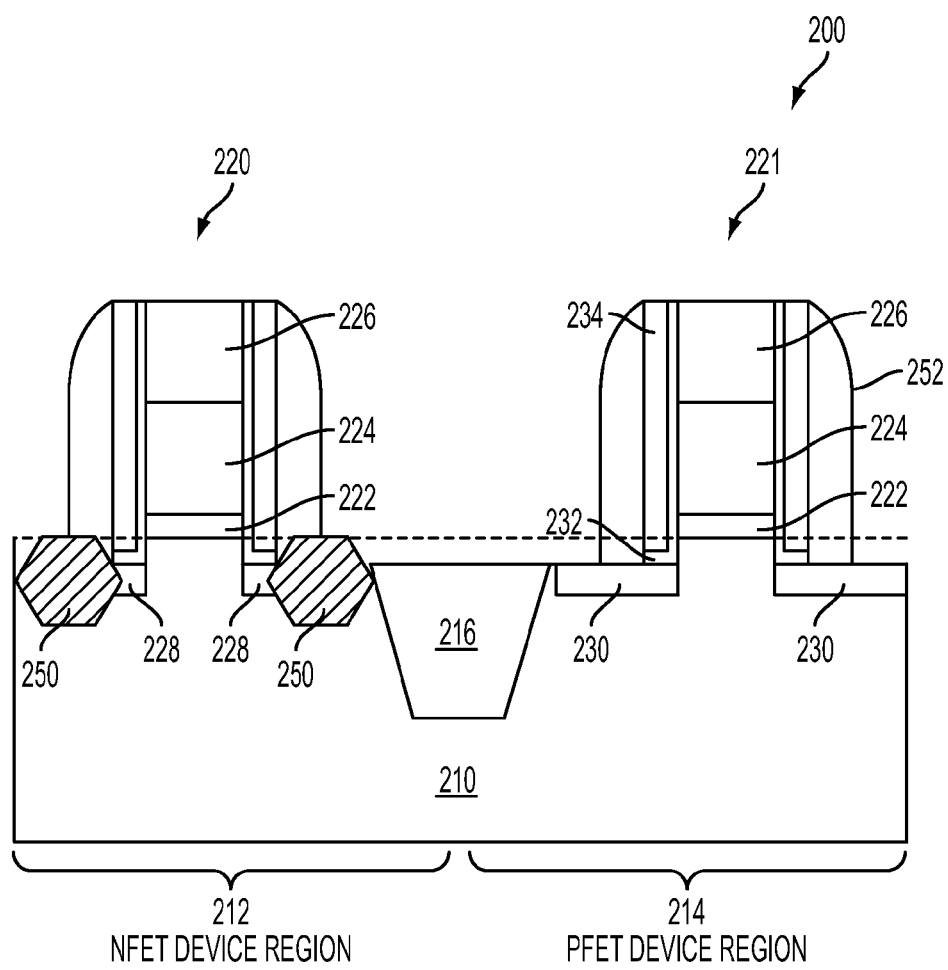

In FIG. 7, spacers 252 (referred to as main spacers) are formed for the gate structures 220 and 221 by a suitable process. For example, the spacers 252 are formed by blanket depositing a dielectric layer, such as a silicon nitride layer, over the integrated circuit device 200, and then, anisotropically etching to remove the dielectric layer to form the spacers 252 as illustrated in FIG. 7. The spacers 252 are positioned on the sidewalls of the gate structures 220 and 221, and in the depicted embodiment, adjacent the offset spacers 234. The spacers 252 comprise a dielectric material, such as silicon nitride, silicon oxide, silicon oxynitride, other suitable materials, or combinations thereof.

Figure 8:
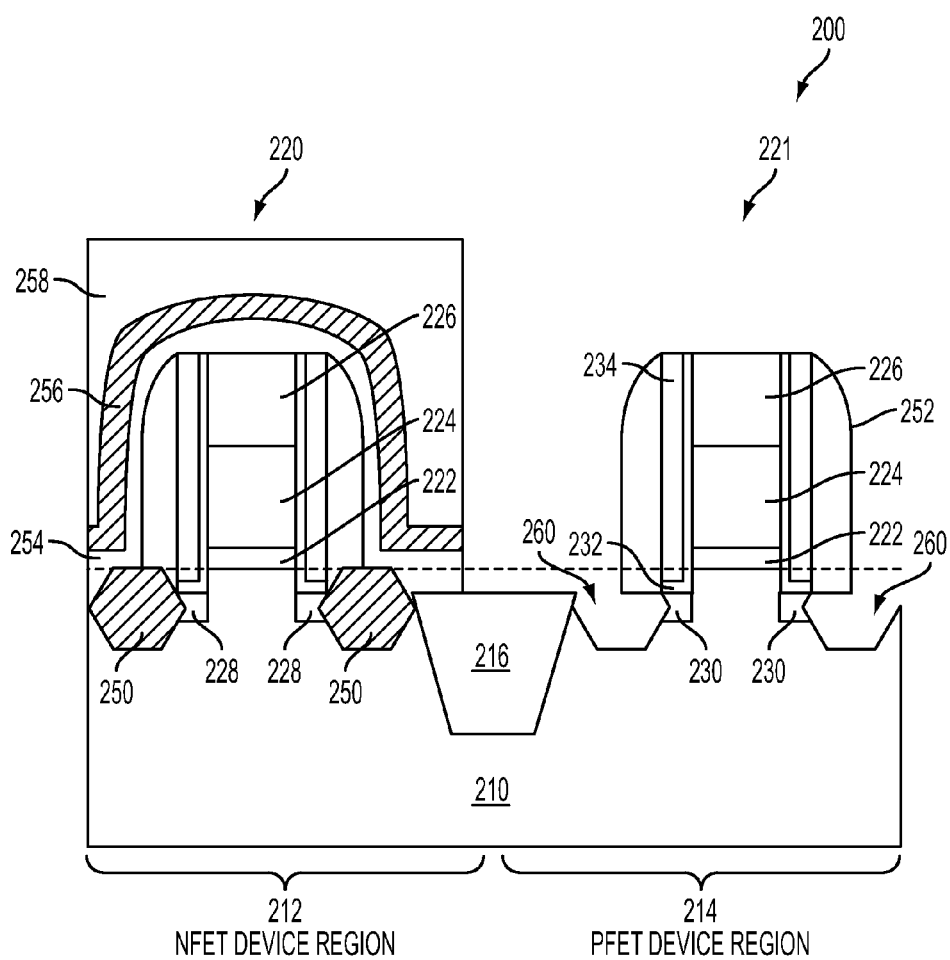
Figure 9:
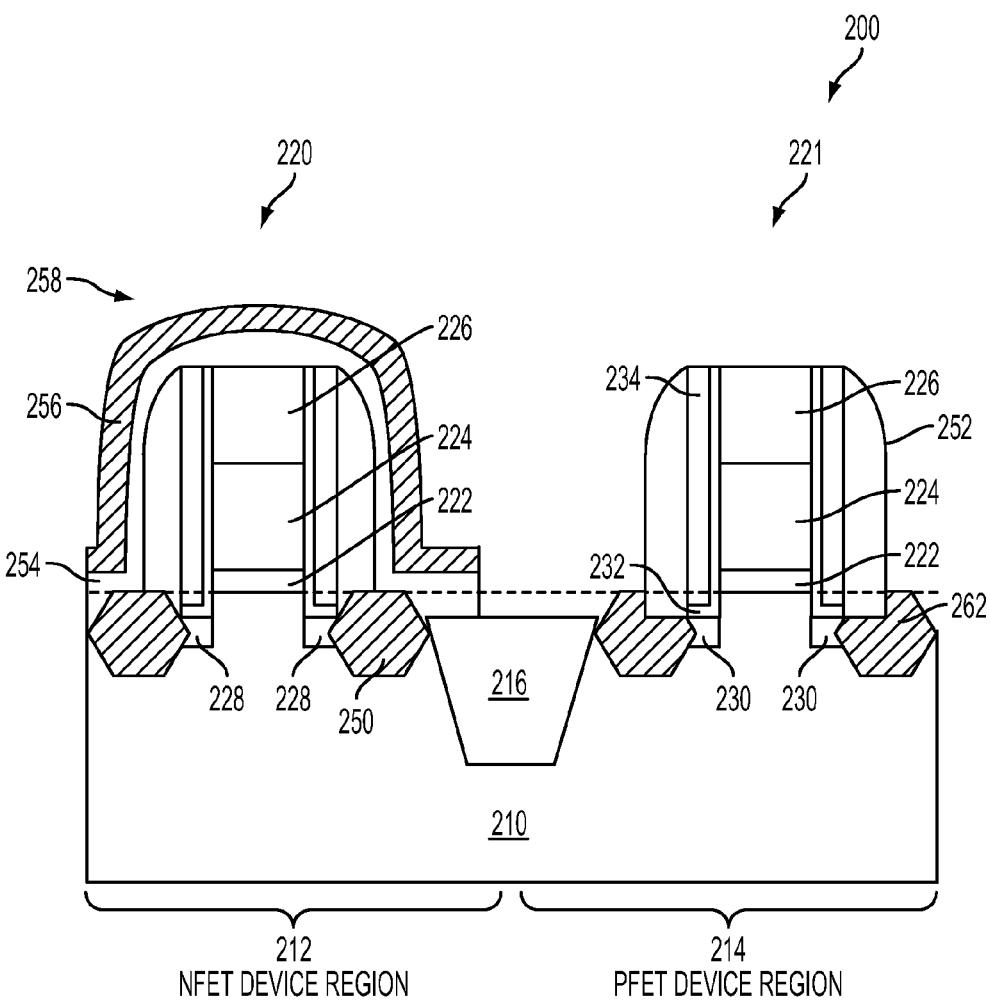

In FIGS. 8 and 9, source/drain (S/D) features are formed in the PFET device region 214. For example, in FIG. 8, portions of the substrate 210 are removed at both sides of the gate structure 221 in the PFET device region 214, particularly in the source and drain region of the PFET device. In the depicted embodiment, a capping layer 254, a capping layer 256, and a photoresist layer 258 are formed over the integrated circuit device 200 and patterned to protect the NFET device during processing of the PFET device region 214. The capping layer 254 may comprise an oxide material, and the capping layer 256 may comprise a nitride material. The capping layers 254 and 256 may comprise other suitable materials as known in the art. The photoresist layer 258 may include an antireflective coating layer, such as a BARC layer and/or a TARC layer. The patterned layers 254, 256, and 258 may be formed by a photolithography process. An exemplary photolithography process may include processing steps of photoresist coating, soft baking, mask aligning, exposing, post-exposure baking, developing photoresist, and hard baking. The photolithography process may also be implemented or replaced by other suitable techniques, such as maskless photolithography, electron-beam writing, ion-beam writing, and molecular imprint.

An etching process then removes portions of the substrate 210 to form recesses 260 in the substrate 210. The recesses 260 are formed in the source and drain regions of the PFET device in the PFET device region 214. The etching process includes a dry etching process, wet etching process, or combination thereof. In the depicted embodiment, the etching process utilizes a combination dry and wet etching. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mT to about 200 mT, a source power of about 200 W to about 2000 W, an RF bias voltage of about 0 V to about 100 V, and an etchant that includes NF$_3$, Cl$_2$, SF$_6$, He, Ar, CF$_4$, or combinations thereof. In an example, the dry etching process includes an etching pressure of about 1 mT to about 200 mT, a source power of about 200 W to about 2000 W, an RF bias voltage of about 0 V to about 100 V, a NF$_3$ gas flow rate of about 5 sccm to about 30 sccm, a Cl$_2$ gas flow rate of about 0 sccm to about 100 sccm, a He gas flow rate of about 0 sccm to about 500 sccm, and an Ar gas flow rate of about 0 sccm to about 500 sccm. In another example, the etching process includes an etching pressure of about 1 mT to about 200 mT, a source power of about 200 W to about 2000 W, an RF bias voltage of about 0 V to about 100 V, a SF$_6$ gas flow rate of about 5 sccm to about 30 sccm, a Cl$_2$ gas flow rate of about 0 sccm to about 100 sccm, a He gas flow rate of about 0 sccm to about 500 sccm, and an Ar gas flow rate of about 0 sccm to about 500 sccm. In yet another example, the etching process includes an etching pressure of about 1 mT to about 200 mT, a source power of about 200 W to about 2000 W, an RF bias voltage of about 0 V to about 100 V, a CF$_4$ gas flow rate of about 5 sccm to about 100 sccm, a Cl$_2$ gas flow rate of about 0 sccm to about 100 sccm, a He gas flow rate of about 0 sccm to about 500 sccm, and an Ar gas flow rate of about 0 sccm to about 500 sccm. The wet etching solutions may include NH$_4$OH, HF (hydrofluoric acid), TMAH (tetramethylammonium hydroxide), other suitable wet etching solutions, or combinations thereof. In an example, the wet etching process first implements a 100 parts water to 1 part HF concentration of an HF solution at room temperature, and then implements a NH$_4$OH solution at a temperature of about 20° C. to about 60° C. In another example, the wet etching process first implements a 100:1 concentration of an HF solution at room temperature, and then implements a TMAH solution at a temperature of about 20° C. to about 60° C. After the etching process, a pre-cleaning process may be performed to clean the recesses 260 with a hydrofluoric acid (HF) solution or other suitable solution.

In FIG. 9, a semiconductor material is deposited in the recesses 260 to form a strained structure in the PFET device region 214. In the depicted embodiment, an epitaxy or epitaxial (epi) process is performed to deposit the semiconductor material in the recesses 260. The epi process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combination thereof. The epi process may use gaseous and/or liquid precursors, which may interact with the composition of the substrate 210. The deposited semiconductor material is different from the substrate 210. Accordingly, the channel region of the PFET device is strained or stressed to enable carrier mobility of the device and enhance device performance. Further, in the depicted embodiment, silicon germanium (SiGe) is deposited by an epi process in the recesses 260 of the substrate 210 to form SiGe source and drain features 262 in a crystalline state on the silicon substrate 210. The SiGe source and drain features 262 may alternatively be referred to as raised source and drain features. The source and drain features 262 of the PFET device associated with the gate structure 221 may be in-situ doped or undoped during the epi process. When the source and drain features are undoped, it is understood that they may be doped in a subsequent process. The doping may be achieved by an ion implantation process, plasma immersion ion implantation (PIII) process, gas and/or solid source diffusion process, other suitable process, or combinations thereof. The source and drain features 262 may further be exposed to annealing processes, such as a rapid thermal annealing process.

Thereafter, the patterned capping layers 252, 254 and 256 are removed by a suitable process. The integrated circuit device 200 continues with processing to complete fabrication as discussed briefly below. For example, heavily doped source/drain (HDD) regions for the NFET device in the NFET device region 212 may be formed by ion implantation of n-type dopants, such as phosphorus or arsenic, and HDD regions for the PFET device in the PFET device region 214 may be formed by ion implantation of p-type dopants, such as boron. It is understood that the HDD regions of the NFET and PFET device regions 212 and 214 may be formed earlier. Additionally, silicide features are formed on the raised source/drain features, for example, to reduce electrical resistance with the contact. The silicide features may be formed on the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to planarize the substrate. Further, a contact etch stop layer (CESL) may be formed on top of the gate structures 220 and 221 before forming the ILD layer. In some embodiments, the gate electrode 224 remains polysilicon in the final device. In other embodiments, the polysilicon is removed and replaced with a metal in a gate last or gate replacement process. In a gate last process, the CMP process on the ILD layer is continued to expose the polysilicon of the gate structures, and an etching process is performed to remove the polysilicon, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate 210 to electrically connect various features or structures of the integrated circuit device 200. The multilayer interconnection includes vertical interconnects, such as conventional vias or contacts, and horizontal interconnects, such as metal lines. The various interconnection features may implement various conductive materials including copper, tungsten and silicide. In at least one example, a damascene process is used to form copper multilayer interconnection structure.

The integrated circuit device 200 serves only as an example. The integrated circuit device 200 may be used in various applications such as digital circuitry, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other types of transistors, including single-gate transistors, double-gate transistors, and other multiple-gate transistors, and may be employed in many different applications, including sensor cells, memory cells, logic cells, and others.

In summary, the disclosed method 100 provides improved protection for the bottom portions of the gate structures. The improved control is achieved by, after forming the gate electrodes, creating recesses on one or both sides of the gate electrodes, so that this extra level of recess ensures that the bottom portions of the gate structures will be fully protected by the spacers that will be formed on the sidewalls of the gate electrodes. It has been observed that the disclosed methods and integrated circuit devices result in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

The present disclosure provides for many different embodiments. One of the broader forms of an embodiment of the present invention involves a method that includes: providing a semiconductor substrate; forming a gate structure over the substrate; forming a recess in the semiconductor substrate on either side of the gate structure; performing an implantation process with a dopant on the substrate, thereby forming a lightly doped source and drain (LDD) region in the substrate, the LDD region being interposed by the gate structure; forming spacers for the gate structure; and forming source and drain features on each side of the gate structure.

Another one of the broader forms of an embodiment of the present invention involves a method that includes: providing a semiconductor substrate having a first region and a second region; forming first and second gate structures over the substrate in the first and second regions, respectively; forming first and second lightly doped source and drain (LDD) regions in the first and second regions, respectively; forming a dielectric layer over the substrate, including over the second gate structure; forming a first recess in the substrate at either side of the gate structures; forming a doped region in the substrate in the second region at either side of the second gate structure; forming spacers for the first and second gate structures; forming a second recess in the substrate at either side of the first gate structure; epitaxially (epi) growing a first semiconductor material to fill the second recess; forming a third recess in the substrate at either side of the second gate structure; and epitaxially (epi) growing a second semiconductor material to fill the third recess, the second semiconductor material being different than the first semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate stack over a substrate, the gate stack having sidewalls;
   forming recesses in the substrate on both sides of the gate stack, wherein sidewalls of the recesses are aligned with the sidewalls of the gate stack, and a top surface of a recessed portion of the substrate is substantially coplanar with a top surface of an isolation feature;
   performing an implantation process with a dopant on the substrate, thereby forming a lightly doped source and drain (LDD) region in the recessed portion of the substrate, the LDD region being co-aligned with both the sidewalls of the recesses and the sidewalls of the gate stack such that an entirety of the LDD region is formed outside a portion of the substrate directly under the gate stack;
   forming spacers on the sidewalls of the gate stack and the sidewalls of the recesses; and
   forming source and drain features on each side of the gate stack, wherein a top surface of the source and drain features is substantially co-planar with a top surface of the substrate under the gate stack.

2. The method of claim 1, wherein the gate stack comprises a gate dielectric layer, a gate layer, and a hard mask layer.

3. The method of claim 1, wherein the substrate comprises various doped regions.

4. The method of claim 3, wherein the isolation feature in the substrate is configured to isolate the various doped regions.

5. The method of claim 1, wherein the forming recesses on both sides of the gate stack is performed by a dry or wet etching process.

6. The method of claim 1, wherein a top surface of the recesses is lower than an original surface of the substrate.

7. The method of claim 1, wherein the forming the source and drain features on each side of the gate stack comprises:
   removing portions of the substrate at both sides of the gate stack, thereby forming additional recesses in the substrate that define a source and drain region in the substrate; and
   epitaxially (epi) growing a semiconductor material to fill the additional recesses, thereby forming the source and drain features.

8. The method of claim 1, wherein the spacer on the sidewalls of the gate stack comprises a spacer liner and an offset spacer.

9. A method comprising:
   forming first and second gate structures over a substrate in first and second regions of the substrate, respectively, the first gate structure having sidewalls;
   forming a doped region in the substrate in the second region at each side of the second gate structure;
   forming a first recess in the substrate at both sides of the first gate structure, the first recess being aligned with the sidewalls of the first gate structure and forming a set of substrate sidewalls co-aligned with the sidewalls on a portion of the substrate directly under the first gate structure wherein the forming of the first recess comprises protecting the first and second gate structures during the forming of the first recess;
   forming the first recess in an isolation feature, wherein a top surface of a recessed portion of the substrate is substantially coplanar with a top surface of the isolation feature;
   forming first lightly doped source and drain (LDD) regions in the substrate below the first recess, the first LDD regions being co-aligned with the set of substrate sidewalls;
   forming second LDD regions in the substrate in the second region;
   forming spacers for the first and second gate structures on the sidewalls and the set of substrate sidewalls;
   forming a second recess in the substrate at both sides of the first gate structure; and
   epitaxially (epi) growing a semiconductor material to fill the second recess, wherein a top surface of the semiconductor material is substantially co-planar with a top-most surface of the substrate.

10. The method of claim 9, wherein the gate structure comprises a gate dielectric layer, a gate layer, and a hard mask layer.

11. The method of claim 10, wherein a top surface of the first recess is lower than the gate dielectric layer.

12. The method of claim 9, wherein the forming the second LDD regions comprises implanting the substrate with a first type dopant, and the forming the doped region comprises implanting the substrate with a second type dopant, the second type dopant being opposite the first type dopant.

13. The method of claim 9, wherein the forming the first LDD regions comprises implanting the substrate with an n-type dopant, and the forming the second LDD regions comprises implanting the substrate with a p-type dopant.

14. The method of claim 9, wherein the forming the doped region comprises implanting the substrate with an n-type dopant.

15. The method of claim 9, wherein the step of epi growing the semiconductor material to fill the second recess comprises epi growing silicon germanium.

16. A method comprising:
   forming first and second gate structures over a substrate in first and second regions, respectively, each of the gate structures comprising a gate stack having sidewalls;
   forming a first recess on both sides of each of the first and second gate structures, the first recess being aligned with the sidewalls, wherein forming the first recess comprises reducing a height of an isolation feature between the first and second gate structures;
   forming first and second lightly doped source and drain (LDD) regions below the first recess in the first and second regions, respectively, the LDD regions being co-aligned with both the first recess and the sidewalls of the first and second gate structures such that an entirety of each of the LDD regions is formed outside portions of the substrate directly under the gate stacks;
   forming offset spacers on the sidewalls of the first and second gate structures;
   forming a second recess in the substrate at both sides of the first gate structure after the forming the first recesses;
   epitaxially (epi) growing a first semiconductor material to fill the second recess;
   forming main spacers for the first and second gate structures;

forming a third recess in the substrate at both sides of the second gate structure; and epitaxially (epi) growing a second semiconductor material to fill the third recess, the second semiconductor material being different than the first semiconductor material, wherein at least one semiconductor material of the first semiconductor material or the second semiconductor material is substantially co-planar with an original top surface of the substrate.

17. The method of claim 16, further comprising forming a doped region in the substrate in the second region at either side of the second gate structure, wherein the forming the second LDD regions comprises implanting the substrate with a first type dopant and forming the doped region comprises implanting the substrate with a second type dopant, the second type dopant being opposite the first type dopant.

18. The method of claim 17, wherein the forming the doped region comprises implanting the substrate with an n-type dopant.

19. The method of claim 16, wherein the forming the first LDD regions comprises implanting the substrate with an n-type dopant, and the forming the second LDD regions comprises implanting the substrate with a p-type dopant.

20. The method of claim 16, wherein the epi growing the first semiconductor material comprises epi growing silicon and the epi growing the second semiconductor material comprises epi growing silicon germanium.

\* \* \* \* \*